United States Patent
Han

(10) Patent No.: US 9,569,142 B2
(45) Date of Patent: Feb. 14, 2017

(54) SEMICONDUCTOR DEVICE AND METHOD OF OPERATING THE SAME ACCORDING TO DEGREE OF DETERIORATION

(71) Applicant: SK hynix Inc., Gyeonggi-do (KR)

(72) Inventor: Ju Hyeon Han, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 19 days.

(21) Appl. No.: 14/696,003

(22) Filed: Apr. 24, 2015

(65) Prior Publication Data

US 2016/0147624 A1    May 26, 2016

(30) Foreign Application Priority Data

Nov. 24, 2014  (KR) .................. 10-2014-0164334

(51) Int. Cl.
| | | |
|---|---|---|
| *G11C 16/34* | (2006.01) | |
| *G06F 3/06* | (2006.01) | |
| *G11C 16/00* | (2006.01) | |
| *G11C 16/10* | (2006.01) | |

(52) U.S. Cl.
CPC ............ *G06F 3/0679* (2013.01); *G06F 3/064* (2013.01); *G06F 3/0619* (2013.01); *G11C 16/00* (2013.01); *G11C 16/3495* (2013.01); *G11C 16/10* (2013.01); *G11C 16/3431* (2013.01)

(58) Field of Classification Search
CPC .... G06F 11/2094; G06F 3/064; G06F 3/0679; G06F 3/0619
See application file for complete search history.

(56) References Cited

U.S. PATENT DOCUMENTS

| | | | |
|---|---|---|---|
| 5,694,356 A | 12/1997 | Wong et al. | |
| 5,978,941 A * | 11/1999 | Katayama | ............... G11C 16/14 |
| | | | 714/718 |
| 2001/0010086 A1 | 7/2001 | Katayama et al. | |
| 2011/0044113 A1* | 2/2011 | Kim | .................... G11C 11/5628 |
| | | | 365/185.19 |
| 2011/0103151 A1* | 5/2011 | Kim | .................... G11C 11/5628 |
| | | | 365/185.19 |

FOREIGN PATENT DOCUMENTS

| | | |
|---|---|---|
| KR | 1020070102178 | 10/2007 |
| KR | 1020110014923 | 2/2011 |

* cited by examiner

*Primary Examiner* — Khamdan Alrobaie
(74) *Attorney, Agent, or Firm* — IP & T Group LLP

(57) ABSTRACT

A semiconductor device and a method of operating the same are provided. The method includes determining the degree of deterioration of a selected memory block, performing a program operation of the selected memory block in a first program operating condition when it is determined that the selected memory block is not deteriorated and performing the program operation of the selected memory block in a second program operating condition when it is determined that the selected memory is deteriorated, and updating the program operating time of the selected memory block.

18 Claims, 6 Drawing Sheets

SEMICONDUCTOR DEVICE AND METHOD OF OPERATING THE SAME ACCORDING TO DEGREE OF DETERIORATION

CROSS-REFERENCE TO RELATED APPLICATION

The present application claims priority to Korean patent application number 10-2014-0164334, filed on Nov. 24, 2014, the entire disclosure of which is incorporated herein in its entirety by reference.

BACKGROUND

Field of Invention

Various Embodiments of the present invention relate to a semiconductor device and a method of operating the same and, more specifically, to a program operation of a semiconductor device.

Discussion of Related Art

Semiconductor devices include memory cells for storing data. Memory cells of a non-volatile memory device may store data even without a constant source of power. Accordingly, memory cell reliability has a great effect on the overall reliability of the semiconductor device.

However, as the number of cycles (i.e., program-erase cycles) of the semiconductor device is increased, the memory cells physically deteriorate. When the number of cycles reaches a specific number, the semiconductor device rapidly deteriorates, and the reliability of the semiconductor device rapidly lowers.

SUMMARY

Various Embodiments of the present invention are directed to a semiconductor device capable of improving reliability of the semiconductor device by changing a condition of a program operation according to the degree of deterioration of the memory blocks, and a method of operating the same.

One aspect of the present invention provides a method of operating a semiconductor device, including: determining degree of deterioration of a selected memory block; performing a program operation on the selected memory block by using a first program operating condition when the selected memory block is determined not to be deteriorated, and performing the program operation on the selected memory block in a second program operating condition when the selected memory is determined to be deteriorated; and updating a program operating time of the selected memory block.

Another aspect of the present invention provides a semiconductor device, including: a plurality of memory blocks; a peripheral circuit suitable for performing a program operation of a selected memory block among the memory blocks; and a control circuit suitable for determining degree of deterioration of the selected memory block among the memory blocks, setting a first program operating condition or a second program operating condition based on the determined result, and controlling the peripheral circuit to perform the program operation on the selected memory block based on the set program operating condition.

Another aspect of the present invention provides a semiconductor device, including: a plurality of memory blocks; and a peripheral circuit suitable for performing a program operation of a selected memory block among the memory blocks. Here, program operating conditions of the selected memory block are adjusted when the selected memory block is determined to be deteriorated based on program operating time.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Hereinafter, exemplary embodiments of the present invention will be described in sufficient detail. However, the present invention may be embodied in different forms and should not be construed as limited to the embodiments set forth herein. Exemplary embodiments of the present invention are described below in sufficient detail with reference to accompanying drawings to enable those of ordinary skill in the art to embody and practice the present invention.

It is also noted that in this specification, "connected/coupled" refers to one component not only directly coupling another component but also indirectly coupling another component through an intermediate component. In addition, a singular form may include a plural form as long as it is not specifically mentioned. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to where the first layer is formed directly on the second layer or the substrate but also where a third layer exists between the first layer and the second layer or the substrate.

Figure 1:
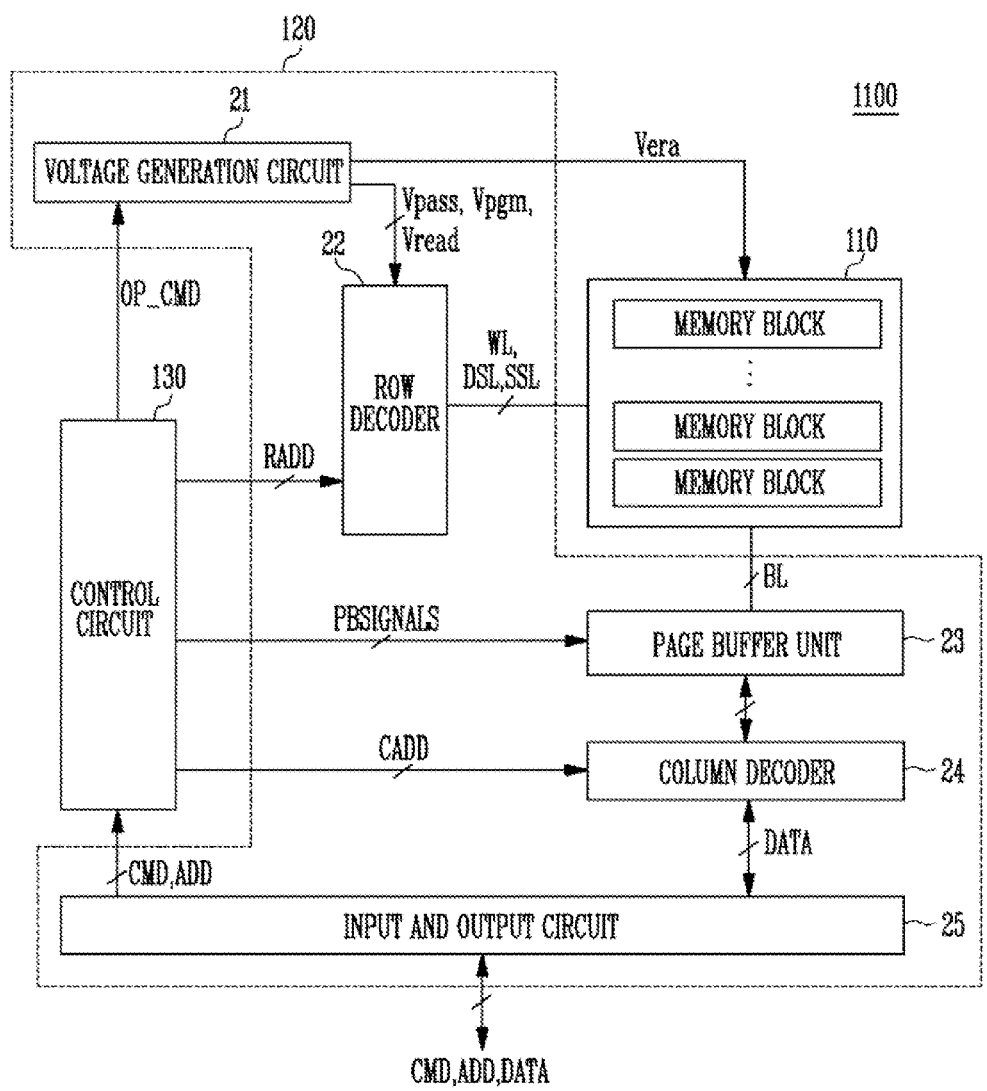
FIG. 1 is a block diagram illustrating a semiconductor device according to an embodiment of the present invention.

FIG. 1 is a block diagram illustrating a semiconductor device 1100 according to an embodiment of the present invention.

Referring to FIG. 1, the device 1100 may include a memory cell array 110 in which data is stored, a peripheral circuit 120 for performing program, read, and erase operations on the memory cell array 110, and a control circuit 130 for controlling the peripheral circuit 120.

The memory cell array 110 may include a plurality of memory blocks. Specifically, the memory blocks may have a two-dimensional structure or a three-dimensional structure. For example, the memory blocks having the two-dimensional structure may include a plurality of cell strings arranged in a direction perpendicular to a semiconductor substrate, and the memory blocks having the three-dimensional structure may include a plurality of cell strings arranged in a vertical direction with respect to the semiconductor substrate. Each of the cell strings may include a drain select transistor, memory cells, and a source select transistor, which are connected in series between bit lines BL and a common source line.

The peripheral circuit 120 may include a voltage generation circuit 21, a row decoder 22, a page buffer unit 23, a column decoder 24, and an input and output circuit 25.

The voltage generation circuit 21 may generate operating voltages having various levels in response to an operating command signal OP_CMD. The operating command signal OP_CMD may include a program command signal, a read command signal, and an erase command signal. For example, the voltage generation circuit 21 may generate an erase voltage Vera, a program voltage Vpgm, a read voltage Vread, and a pass voltage Vpass, and generate voltages having various other levels.

The row decoder 22 may select one among the memory blocks included in the memory cell array 110 in response to a row address RADD, and transfer the operating voltages to word lines WL, drain select lines DSL, and source select lines SSL connected to a selected memory block.

The page buffer unit 23 may be connected to memory blocks through the bit lines BL, exchange data with the selected memory block in the program, read, and erase operations, and temporarily store the data to be exchanged. The page buffer unit 23 includes a plurality of page buffers corresponding to respective columns. The page buffer unit 23 may be operated in response to page buffer control signals PBSIGNALS.

The column decoder 24 may select a column corresponding to a column address CADD.

The input and output circuit 25 may transfer a command signal CMD and an address ADD transferred from the outside to the control circuit 130, transfer data DATA transferred from the outside to the column decoder 24, and output the data DATA transferred from the column decoder 24 to the outside or transfer the data DATA to the control circuit 130.

The control circuit 130 may control the peripheral circuit 120 in response to the command signal CMD and the address ADD. For example, the control circuit 130 may control the peripheral circuit 120 to perform the program, read, and erase operations in response to the command signal CMD and the address ADD. The program operation may be performed in an incremental step pulse program (ISPP) manner in which the program voltage is increased by a step voltage in stages. Specifically, in the program operation, the control circuit 130 may check the degree of deterioration of the selected memory block, and control the peripheral circuit 120 to perform the program operation by changing a program operation condition according to the degree of deterioration. For example, the control circuit 130 may compare a previous program operating time and a normal program operating time of the selected memory block, and determine the degree of deterioration of the selected memory block. When the previous program operating time of the selected memory block becomes shorter than the normal program operating time of the selected memory block, the control circuit 130 may determine that the selected memory block is deteriorated, and control the peripheral circuit 120 to perform the program operation of the selected memory block by changing the program operating conditions. The program operating conditions may be stored by classifying a first parameter including operating condition information in a normal state and a second parameter including operating condition information in a deterioration state. The first and second parameters may include a start program voltage, a step voltage, a program pass voltage, the maximum number of program pulses, etc. When the memory block is deteriorated, since the program operating time is shortened, information on the start program voltage and the step voltage having levels which are lower than those of the first parameter may be included in the second parameter.

Information regarding the program operating time and the normal program operating time may be stored in a storage unit included in the semiconductor device 1100. A portion of the memory block included in the memory cell array 110 or a separate storage unit included in the control circuit 130 may be used as the storage unit in which the information regarding the program operating time and the normal program operating time is stored. Further, since the degree of deterioration of each memory block may be different, the information regarding a different normal program operating time for each memory block may be stored. The information regarding the normal program operating time of each memory block may be stored in the storage unit by performing a test program operation.

Figure 2:
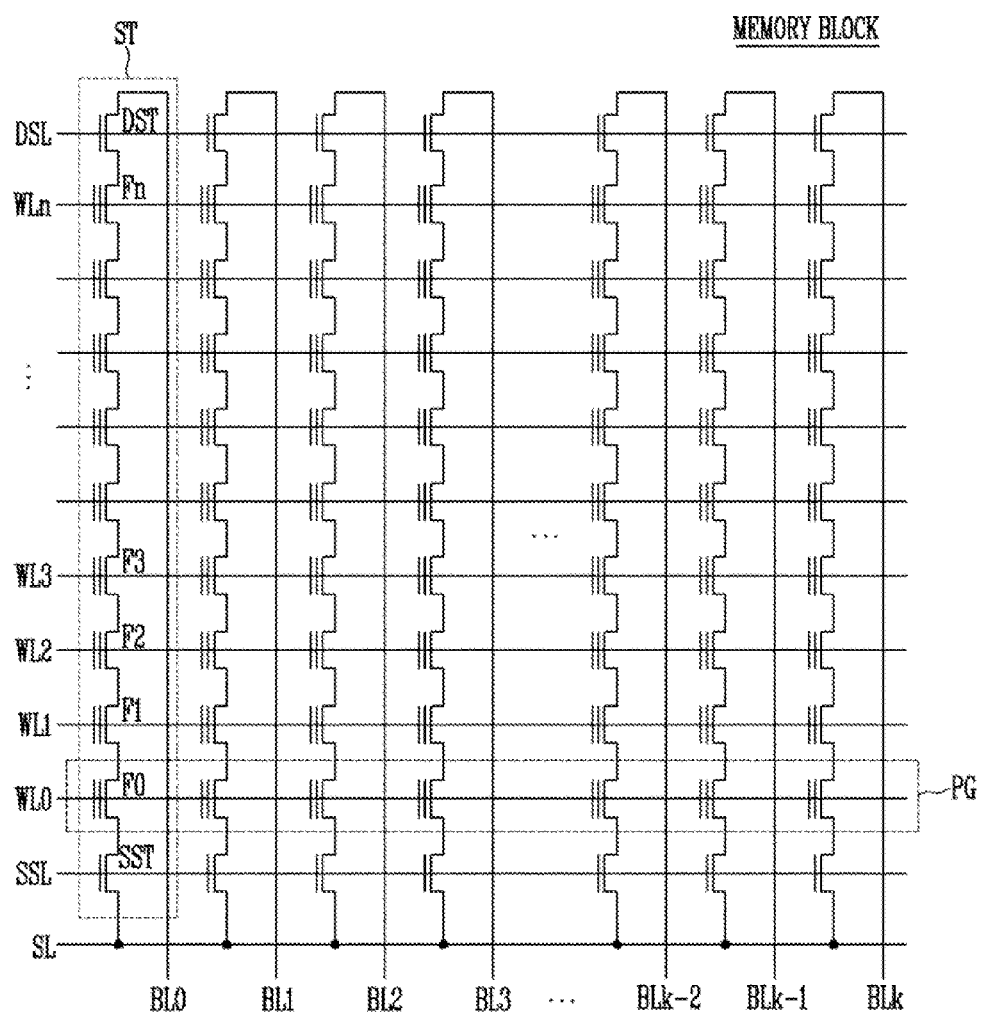
FIG. 2 is a detailed diagram of a memory block shown in FIG. 1.

FIG. 2 is a detailed diagram for describing the memory block shown in FIG. 1.

Since each of the memory blocks has the same configuration, an example of one memory block will be described.

Referring to FIG. 2, the memory block may include a plurality of cell strings. The cell strings may be connected between a common source line SL and bit lines BL0 to BLk. Since each of the cell strings has the same configuration, an example of one cell string ST will be described.

The cell string ST may include a source select transistor SST, a plurality of memory cells F0 to Fn, and a drain select transistor DST, which are connected in series between the common source line SL and the bit line BL0. A source of the source select transistor SST may be connected to the common source line SL, and a drain of the drain select transistor DST may be connected to the bit line BL0.

Gates of the source select transistors SST included in different cell strings may be connected to the source select line SSL, gates of the memory cells F0 to Fn may be connected to a plurality of word lines WL0 to WLn, and gates of the drain select transistors DST may be connected to the drain select line DSL. A group of the memory cells connected to the same word line may be referred to as a page PG, and the program operation may be performed in units of pages PG.

Figure 3:
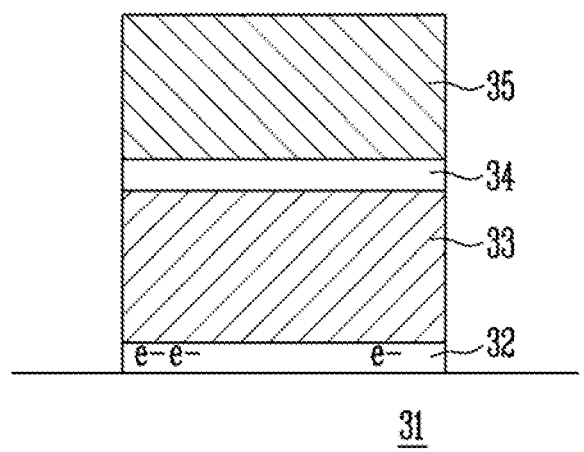
FIG. 3 is a diagram for describing deterioration of memory cells due to increases in the number of cycles.

FIG. 3 is a diagram for describing deterioration of a memory cell due to an increase in the number of cycles.

Referring to FIG. 3, a memory cell may deteriorate as the number of cycles is increased. The number of cycles may be increased by one whenever the erase operation and the program operation are performed once. For example, a non-volatile memory cell may include a tunnel insulating film 32, a floating gate 33, a dielectric film 34, and a control gate 35 which are stacked on a substrate 31. When the program operation is performed, negative charges (denoted as 'e−'s in FIG. 3) distributed in the substrate 31 may move to the floating gate 33 through the tunnel insulating film 32. This phenomenon may be referred to as tunneling. When the erase operation is performed, negative charges distributed in the floating gate 33 may move to the substrate 31 through the tunnel insulating film 32. As the erase operation and the program operation are repeatedly performed, that is, as the number of cycles is increased, the memory cell deteriorates, and the number of negative charges that do not escape from the tunnel insulating film 32 and are trapped in the tunnel insulating film 32 may increase. Specifically, in the program operation, when the number of negative charges that are trapped in the tunnel insulating film 32 are increased, since it may be determined that the threshold voltage is high although the number of negative charges stored in the floating gate 33 is smaller than a reference value, the program operating time tPROG may shorten. That is, a program verifying operation of a selected memory block should actually be determined to have failed, but the program verifying operation may pass.

Figure 4:
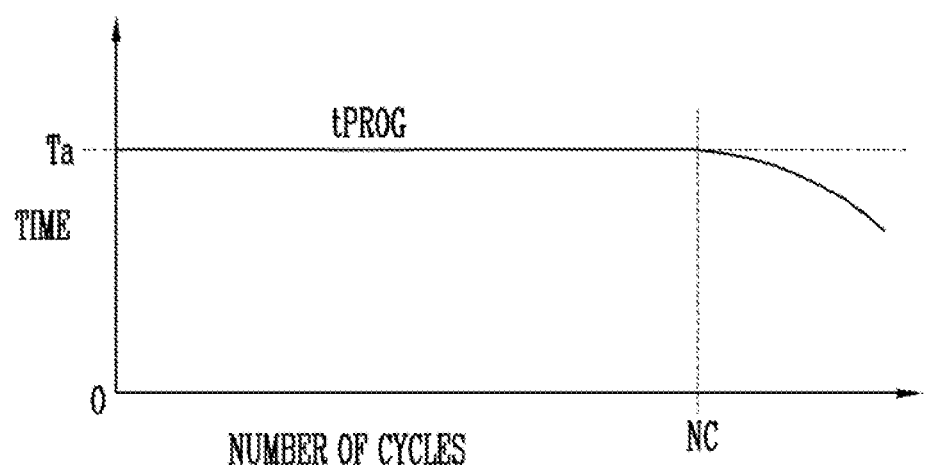
FIG. 4 is a graph illustrating program operating time with respect to the number of cycles.

FIG. 4 is a graph illustrating program-operating time with respect to the number of cycles.

Referring to FIG. 4, the program operating time and the number of cycles may have a logarithmic functional relation. More specifically, the program operating time may not shorten whenever the number of cycles is increased, but may abruptly shorten after the number of cycles reaches a specific number. For example, although the program operating time tPROG constantly maintains the normal program operating time Ta before the number of cycles reaches a threshold number Nc, when the number of cycles is equal to or more than the threshold number Nc, the program operating time tPROG may abruptly shorten.

Figure 5:
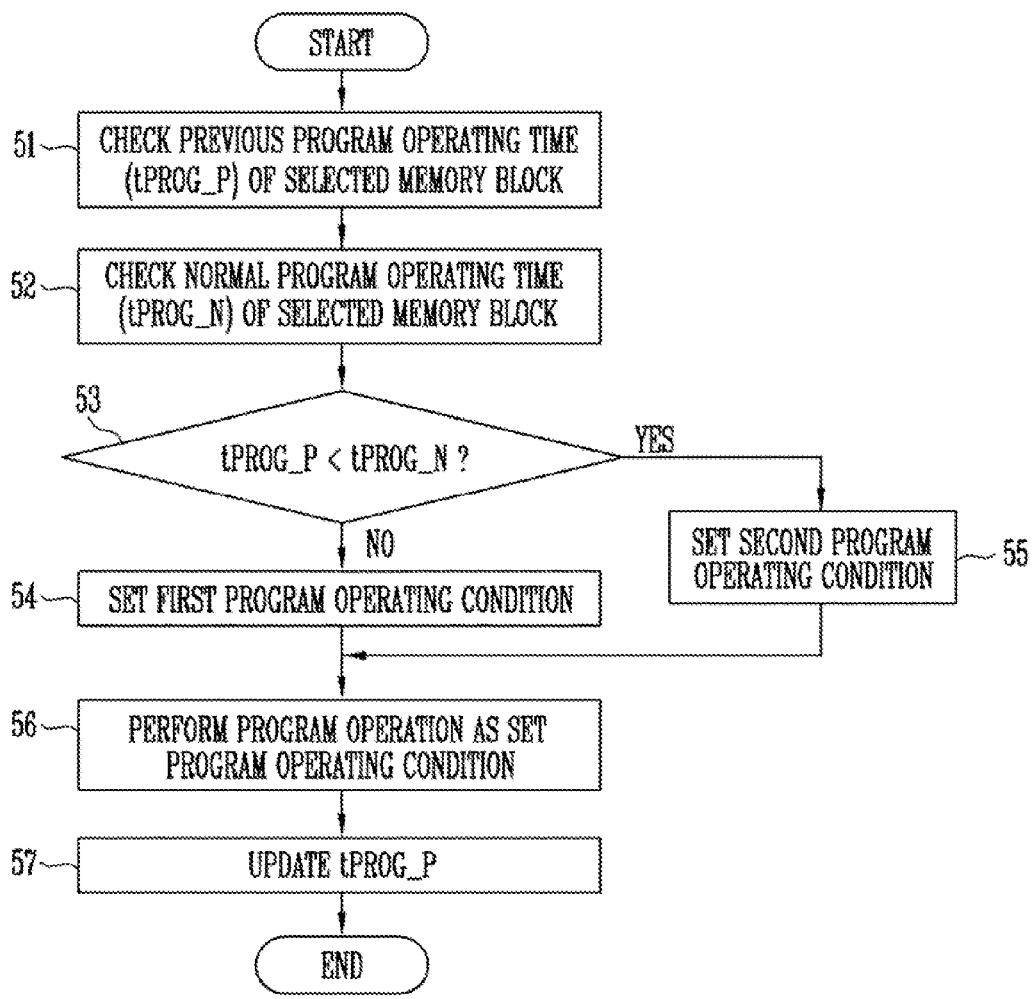
FIG. 5 is a flowchart for describing an operation method according to an embodiment of the present invention.

FIG. 5 is a flowchart for describing an operation method according to an embodiment of the present invention.

Referring to FIG. 5, when the program operation is started, a previous program operating time tPROG_P of a selected memory block is checked (51). For example, a storage unit in which information regarding the previous program operating time tPROG_P of the selected memory block is stored may be read, and the previous program operating time tPROG_P may be checked. The previous program operating time tPROG_P may vary according to the degree of deterioration of the selected memory block. Next, a normal program operating time tPROG_N of the selected memory block may be checked (52). For example, the storage unit in which information regarding the normal program operating time tPROG_N of the selected memory block is stored may be read, and the normal program operating time tPROG_N may be checked. Since the normal program operating time tPROG_N is fixed for each memory block, the normal program operating time tPROG_N may not be varied. The previous program operating time tPROG_P and the normal program operating time tPROG_N may be compared (53). When the previous program operating time tPROG_P is equal to or longer than the normal program operating time tPROG_N, a first program operating condition may be set (54), and when the previous program operating time tPROG_P is shorter than the normal program operating time tPROG_N, a second program operating condition may be set (55).

The first and second program operating conditions may be set as parameters in which the program operating condition is included, and may be previously stored in the storage unit of the semiconductor device. The conditions regarding various operations of the semiconductor device may be digitized, and the digitized conditions may be stored in the storage unit of the semiconductor device. When a corresponding operation is performed, a voltage level, a time, and the number of pulses, etc. may be set according to the stored operating conditions, and at this time, the digitized conditions regarding various operations may be a parameter. The first program operating condition may include a first parameter regarding the program operating conditions before the selected memory block is deteriorated, and the second program operating conditions may include a second parameter regarding the program operating conditions when it is determined that the selected memory block is deteriorated. The start program voltage and the step voltage of the second parameter, having lower levels than those of the first parameter, may be stored. Differences in levels of the start program voltage and the step voltage included in the first and second parameters may be set as levels of a time in which the program operating time may be recovered to the normal program operating time in the test program operation.

When the first or second program operating conditions is set (54 or 55), the program operation of the selected memory block may be performed as the set program operating condition (56). When the program operation of the selected memory block is completed, the program operating time tPROG_P of the selected memory block may be updated to a time in which the program operation is performed (57). The updated program operating time tPROG_P may be used as the previous program operating time tPROG_P when performing a next program operation of the selected memory block.

As described above, the degree of deterioration of the selected memory block may be determined from the previous program operating time, the program operation may be performed differently by setting the program operating conditions of the selected memory block according to the determination result, and thus reliability of the program operation may be improved. Further, differences between the previous program operating time and the normal program operating time may be divided into a plurality of periods, the program operating conditions may be changed according to a parameter corresponding to each period, and thus reliability of the program operation may be further improved. For example, as the difference between the previous program operation time and the normal program operation time is increased, levels of the start program voltage and the step voltage included in the parameter may be set to decrease.

In the above-described embodiment, a degree of deterioration of a memory block may be determined according to the amount of time taken to complete the program operation. However, the degree of deterioration may be determined according to the number of program loops. As the memory block is deteriorated, the amount of time taken to complete the program operation may decrease. Therefore, the number of program loops may gradually decrease as the memory block is deteriorated. For example, data about the number of program loops before the memory bock is deteriorated may be previously stored in the semiconductor device 1100. During the program operation, the number of program loops when the program operation is completed may be counted, and when the number of program loops is less than a predetermined number, the memory block may be determined to be deteriorated.

Figure 6:
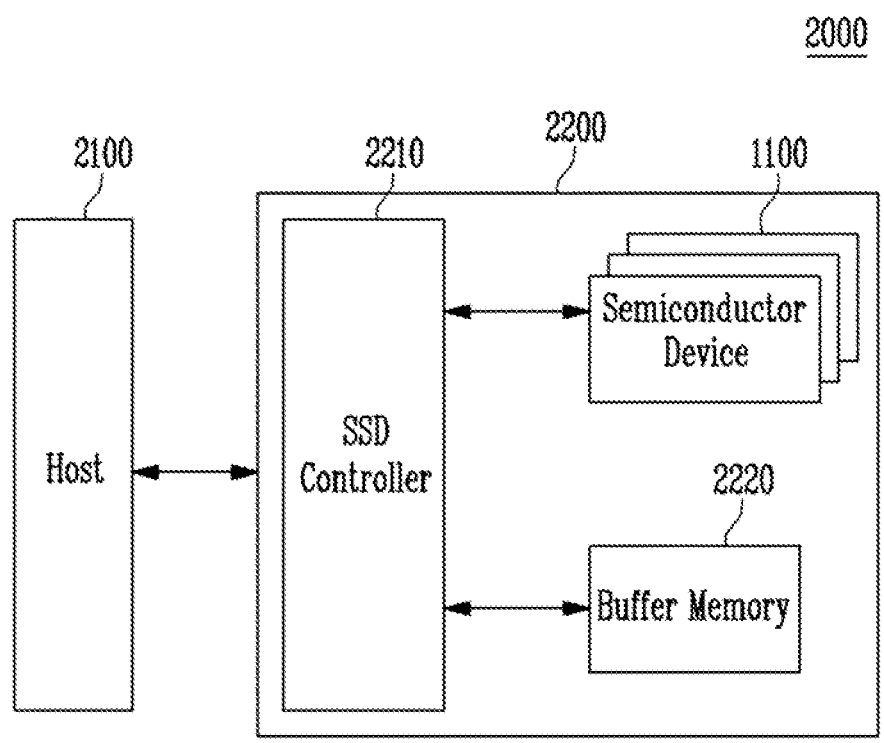
FIG. 6 is a block diagram illustrating a drive device including a semiconductor device according to the embodiments of the present invention.

FIG. 6 is a block diagram illustrating a drive device 2000 including a semiconductor device according to an embodiment of the present invention.

Referring to FIG. 6, the drive device 2000 may include a host 2100 and a solid-state drive (SSD) 2200. The SSD 2200 may include an SSD controller 2210, a buffer memory 2220, and a semiconductor device 1100.

The SSD controller 2210 may provide a physical connection between the host 2100 and the SSD 2200. That is, the SSD controller 2210 may provide an interface with the SSD 2200 corresponding to a bus format of the host 2100. Specifically, the SSD controller 2210 may decode a command provided from the host 2100. The SSD controller 2210 may access the semiconductor device 1100 based on the decoded result. The bus format of the host 2100 may include at least one among a Universal Serial Bus (USB) protocol, a Small Computer System Interface (SCSI) protocol, a Parallel Component Interconnect (PCI)-Express (PCI-E) protocol, an Advanced Technology Attachment (ATA) protocol, a Parallel ATA (PATA) protocol, a Serial ATA (SATA) protocol, a Serial Attached SCSI (SAS) protocol, etc.

Program data provided from the host 2100 and data read from the semiconductor device 1100 may be temporarily stored in the buffer memory 2220. When a request of the read operation is received from the host 2100 and data present in the semiconductor device 1100 is cached, the buffer memory 2220 may support a cache function of directly providing the cached data to the host 2100. Generally, data transmission speed by the bus format (for example, SATA or SAS) of the host 2100 may be faster than that of the memory channel of the SSD 2200. That is, when an interface speed of the host 2100 is faster than the transmission speed of the memory channel of the SSD 2200, deterioration of performance caused by the speed difference may be minimized by providing buffer memory 2220 of a large capacity. The buffer memory 2220 may be provided as a synchronous dynamic random access memory (SDRAM) to provide sufficient buffering in an SSD 2200 used as an auxiliary storage device with large capacity.

The semiconductor device 1100 may be provided as a storage medium of the SSD 2200. For example, the semiconductor device 1100 may be provided as a non-volatile memory device of a large capacity as described with reference to FIG. 1, and may be provided as a NAND-type flash memory among the non-volatile memory devices.

Figure 7:
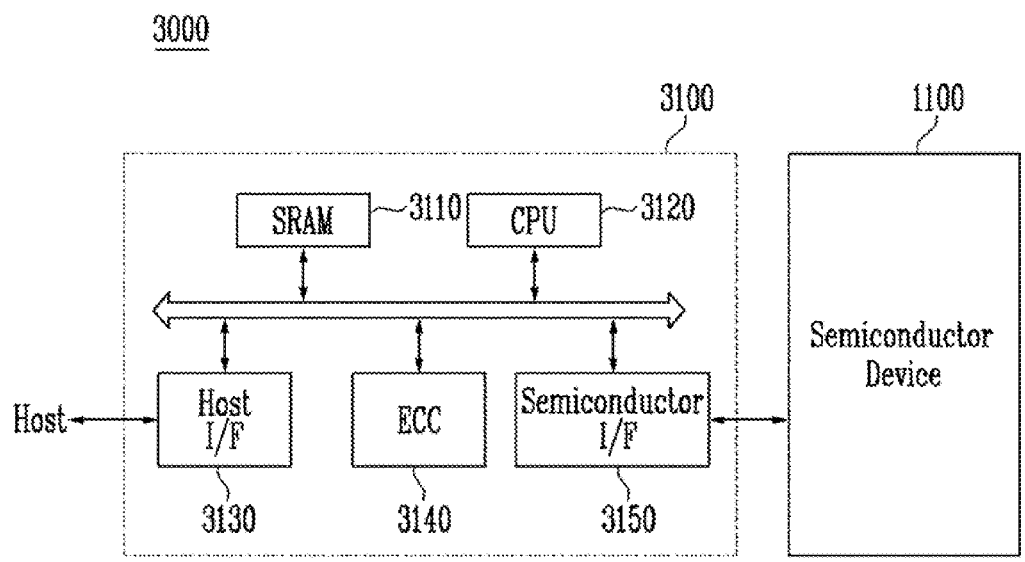
FIG. 7 is a block diagram illustrating a memory system including a semiconductor device according to an embodiment of the present invention.

FIG. 7 is a block diagram illustrating a memory system including a semiconductor device according to an embodiment of the present invention.

Referring to FIG. 7, a memory system 3000 may include a memory controller 3100 and a semiconductor device 1100.

Since the semiconductor device 1100 may have substantially the same configuration as FIG. 1, a detailed description of the semiconductor device 1100 will be omitted.

The memory controller 3100 may control the semiconductor device 1100. An SRAM 3110 may be used as an operating memory of a central processing unit (CPU) 3120. A host interface (I/F) unit 3130 may include a data exchange protocol of the host connected to the memory system 3000. An error correction circuit (ECC) 3140 included in the memory controller 3100 may detect an error included in data read from the semiconductor device 1100, and correct the detected error. A semiconductor interface (I/F) unit 3150 may perform an interface with the semiconductor device 1100. The CPU 3120 may perform a control operation for data exchange of the memory controller 3100. Further, although not shown in FIG. 7, the memory system 3000 may further include RAM (not shown) for storing code data for an interface with the host.

The memory system 3000 according to the present invention may be provided as at least one among a computer, an ultra mobile personal computer (UMPC), a workstation, a net-book, a personal digital assistant (PDA), a portable computer, a web tablet, a wireless phone, a mobile phone, a smartphone, a digital camera, a digital audio recorder, a digital audio player, a digital picture recorder, a digital picture player, a digital video recorder, a digital video player, a device for wirelessly transmitting and receiving information, and one among various electronic devices configuring a home network.

Figure 8:
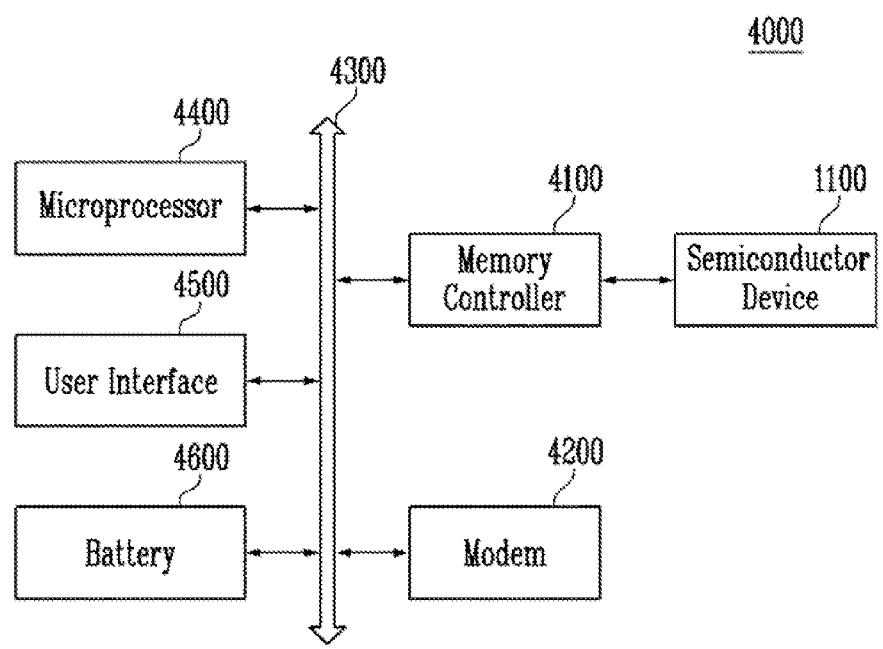
FIG. 8 is a block diagram illustrating a computing system including a semiconductor device according to an embodiment of the present invention.

FIG. 8 is a schematic diagram illustrating a configuration of a computing system including a semiconductor device according to an embodiment of the present invention.

Referring to FIG. 8, a computing system 4000 may include a semiconductor device 1100, a memory controller 4100, a modem 4200, a microprocessor 4400, and a user interface (I/F) unit 4500, which are electrically connected to a bus 4300. When the computing system 4000 according to the present invention is a mobile device, a battery 4600 for supplying an operating voltage of the computing system 4000 may be further included. Although not shown, the computing system 4000 according to the present invention may further include an application chip set, a camera image processor (CIS), a mobile DRAM, etc.

Since the semiconductor device 1100 may have substantially the same configuration as FIG. 1, a detailed description of the semiconductor device 1100 will be omitted.

The memory controller 4100 and the semiconductor device 1100 may configure an SSD.

The semiconductor device and the memory controller according to an embodiment of the present invention may be mounted in various types of packages. For example, the semiconductor device and the memory controller may be packaged and mounted in a manner such as a package on package (PoP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), or the like.

According to the present invention, the reliability of the program operation may be improved by changing the program operating conditions according to the degree of deterioration of the semiconductor device, and the reliability of the semiconductor device may be improved.

The technical spirit of the present invention described above has been described with reference to exemplary embodiments in detail, but it should be noted that the embodiments are used for the description only and are not intended to limit the scope of the invention. Therefore, it will be understood by those of ordinary skill in the art that various changes in form and detail may be made without departing from the spirit and scope of the present invention as defined by the following claims.

What is claimed is:

1. A method of operating a semiconductor device, comprising:

determining a degree of deterioration of a selected memory block, wherein the degree of deterioration of the selected memory block is determined by comparing a previous program operating time and a normal program operating time for the selected memory block;

performing a program operation on the selected memory block by using a first program operating condition when the selected memory block is determined not to be deteriorated, and performing the program operation on the selected memory block by using a second program operating condition when the selected memory is determined to be deteriorated; and updating a program operating time of the selected memory block.

2. The method of operating the semiconductor device of claim 1, wherein the normal program operating time is fixed to a value that is predetermined in a previous test operation for the semiconductor device.

3. The method of operating the semiconductor device of claim 2, wherein the normal program operating time is separately set for each memory block.

4. The method of operating the semiconductor device of claim 1, wherein the selected memory block is determined to be deteriorated when the previous program operating time is shorter than the normal program operating time, and the selected memory block is determined not to be deteriorated when the previous program operating time is equal to or longer than the normal program operating time.

5. The method of operating the semiconductor device of claim 1, wherein the first and second program operating conditions include parameters including a condition of the program operation.

6. The method of operating the semiconductor device of claim 5, wherein the parameters include information regarding various operations that are previously stored in a storage unit of the semiconductor device.

7. The method of operating the semiconductor device of claim 6, wherein the parameter includes at least one of a start program voltage, a step voltage, a program pass voltage, and the maximum number of program pulses.

8. The method of operating the semiconductor device of claim 5, wherein, under the second program operating condition, the start program voltage and the step voltage are set to have lower levels than those under the first program operating condition.

9. The method of operating the semiconductor device of claim 1, wherein the updated program operating time of the selected memory block is used as the previous program operating time when a next program operation of the selected memory block is performed.

10. A semiconductor device, comprising:
a plurality of memory blocks;
a peripheral circuit suitable for performing a program operation on a selected memory block among the memory blocks; and
a control circuit suitable for determining degree of deterioration of the selected memory block, setting a first program operating condition or a second program operating condition based on the determined result, and controlling the peripheral circuit to perform the program operation on the selected memory block based on the set program operating condition, wherein the control circuit determines the degree of deterioration of the selected memory block by comparing a previous program operating time and a normal program operating time for the selected memory block.

11. The semiconductor device of claim 10, wherein the control circuit determines that the selected memory block is deteriorated when the previous program operating time is shorter than the normal program operating time, and
wherein the control circuit determines that the selected memory block is not deteriorated when the previous program operating time is equal to or longer than the normal program operating time.

12. The semiconductor device of claim 10, wherein the previous program operating time and the normal program operating time are stored in one of the memory blocks or a storage unit included in the control circuit.

13. The semiconductor device of claim 10, wherein the first and second program operating conditions include information regarding at least one of a start program voltage, a step voltage, a program pass voltage, and the maximum number of program pulses.

14. The semiconductor device of claim 13, wherein, under the second program operating condition, the start program voltage and the step voltage have lower levels than those under the first program operating condition.

15. The semiconductor device of claim 10, wherein the normal program operating time is separately set for each memory block.

16. The semiconductor device of claim 10, wherein, when the program operation of the selected memory block is completed, the control circuit updates the previous program operating time.

17. The semiconductor device of claim 16, wherein, when a next program operation for the selected memory block is performed, the control circuit updates the previous program operating time when the program operation using the updated program operating time as the previous program operating time is completed.

18. A semiconductor device, comprising:
a plurality of memory blocks; and
a peripheral circuit suitable for performing a program operation of a selected memory block among the memory blocks,
wherein a program operating condition of the selected memory block is adjusted when the selected memory block is determined to be deteriorated by comparing a previous program operating time and a normal program operating time for the selected memory block.

* * * * *